(12) United States Patent
Prieto Herrera et al.

(10) Patent No.: US 9,997,431 B2
(45) Date of Patent: Jun. 12, 2018

(54) ELECTRONIC DEVICE PROVIDED WITH A THERMAL DISSIPATION MEMBER

(71) Applicants: STMicroelectronics (Crolles 2) SAS, Crolles (FR); STMicroelectronics SA, Montrouge (FR); Commissariat A L'Energie Atomique et aux Energies Alternatives, Paris (FR)

(72) Inventors: Rafael Augusto Prieto Herrera, Grenoble (FR); Jean-Philippe Colonna, Corenc (FR); Perceval Coudrain, Grenoble (FR)

(73) Assignees: STMicroelectronics (Crolles 2) SAS, Crolles (FR); STMicroelectronics SA, Montrouge (FR); Commissariat A L'Energie Atomique et aux Energies Alternatives, Paris (FR)

(*) Notice: Subject to any disclaimer, the term of this patent is extended or adjusted under 35 U.S.C. 154(b) by 0 days. days.

(21) Appl. No.: 15/451,862

(22) Filed: Mar. 7, 2017

(65) Prior Publication Data
US 2017/0287806 A1   Oct. 5, 2017

(30) Foreign Application Priority Data
Mar. 30, 2016 (FR) ..................................... 16 52720

(51) Int. Cl.
*H01L 23/367* (2006.01)
*H01L 23/31* (2006.01)
(Continued)

(52) U.S. Cl.
CPC ...... *H01L 23/3672* (2013.01); *H01L 23/3185* (2013.01); *H01L 23/373* (2013.01);
(Continued)

(58) Field of Classification Search
CPC .................................................. H01L 23/3672
(Continued)

(56) References Cited

U.S. PATENT DOCUMENTS 5,675,182 A * 10/1997 Moscicki .......... H01L 23/49568
165/80.3
6,188,578 B1 * 2/2001 Lin .......................... H01L 23/36
165/185

(Continued)

FOREIGN PATENT DOCUMENTS

| DE | 102005023129 A1 | 11/2006 |
| JP | H08241940 A | 9/1996 |
| JP | H1168360 A | 3/1999 |

OTHER PUBLICATIONS

INPI Search Report and Written Opinion for FR 1652720 dated Jan. 18, 2017 (7 pages).

*Primary Examiner* — George Fourson, III
(74) *Attorney, Agent, or Firm* — Crowe & Dunlevy

(57) ABSTRACT

An electronic device includes a support and a component in the form of an integrated circuit chip having a rear face mounted above a front face of the support and a front face opposite its rear face. A block is provided for at least partially encapsulating the component above the front face of the support. The device also includes at least one thermal dissipation member having a flexible sheet having at least two portions folded onto one another while forming at least one fold between them, these portions facing one another at least partly.

26 Claims, 3 Drawing Sheets

(51) Int. Cl.
*H01L 23/373* (2006.01)
*H01L 23/498* (2006.01)
*H01L 23/00* (2006.01)
*H01L 23/433* (2006.01)

(52) U.S. Cl.
CPC ...... *H01L 23/3736* (2013.01); *H01L 23/4334* (2013.01); *H01L 23/49816* (2013.01); *H01L 24/16* (2013.01); *H01L 2224/16225* (2013.01); *H01L 2924/1816* (2013.01)

(58) Field of Classification Search
USPC .................................................. 257/712, 796
See application file for complete search history.

(56) References Cited

U.S. PATENT DOCUMENTS

| | | | | |
|---|---|---|---|---|
| 6,714,416 | B1* | 3/2004 | McLeod | H01L 23/4093 24/296 |
| 2002/0121365 | A1* | 9/2002 | Kozyra | F28F 3/025 165/185 |
| 2002/0131238 | A1* | 9/2002 | Fisher | H01L 23/3672 361/719 |
| 2006/0087015 | A1 | 4/2006 | Yuan et al. | |
| 2006/0137733 | A1* | 6/2006 | Schripsema | H01L 31/048 136/246 |
| 2007/0200209 | A1* | 8/2007 | Fukuzono | H01L 23/42 257/675 |
| 2008/0135999 | A1* | 6/2008 | Yang | H01L 23/467 257/680 |
| 2009/0026605 | A1* | 1/2009 | Gupta | H01L 23/3677 257/712 |
| 2010/0006260 | A1* | 1/2010 | Oh | H01L 23/3672 165/80.2 |
| 2013/0285233 | A1* | 10/2013 | Bao | H01L 23/427 257/706 |

* cited by examiner

ELECTRONIC DEVICE PROVIDED WITH A THERMAL DISSIPATION MEMBER

RELATED APPLICATION

This application claims the benefit and priority of French Pat. App. No. 1652720, filed Mar. 30, 2016, the contents of which are hereby incorporated by reference in their entirety.

TECHNICAL FIELD

This disclosure relates to the field of electronic devices which include integrated circuit chips.

BACKGROUND

In the field of devices which include a support wafer, an integrated circuit chip mounted on the support wafer, and a chip encapsulation block, which are commonly referred to as electronic packages, there is a difficulty in removing the heat produced by the chips.

In order to attempt to resolve this difficulty, a variety of conventional approaches have been tried.

One approach involves adhesively bonding an external metal plate onto the chip, with this metal plate optionally including fins which are spaced apart so as to form a radiator for dissipating the heat produced by the chip.

Another approach includes placing the chip against the casing of a device, for example a mobile telephone, with the casing being used to diffuse the heat produced by the chip.

These conventional approaches, however, may not provide the desired degree of heat dissipation. Therefore, further development is desired.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

One embodiment provides an electronic device including a support, a component capable of producing heat, in particular an integrated circuit chip having a rear face mounted above a front face of the support and a front face opposite its rear face, and a block for at least partial encapsulation of the chip above the front face of the support wafer.

The device has at least one thermal dissipation member with a flexible sheet having at least two portions folded onto one another while forming a fold between them, and these portions face one another at least partly.

The portions of the flexible sheet may be at a distance from one another.

One of the portions may have at least one local region adhesively bonded onto the other portion, or onto the chip or onto the support.

The flexible sheet may include at least a plurality of portions folded successively onto one another while forming folds between them.

The flexible sheet may have at least one main part including at least the one of the portions, and at least one secondary part with at least the other of the portions, the main part extending at least partly above the front face of the component.

The secondary part may have at least one portion folded onto the main part.

The secondary part may have at least one folded portion placed at the periphery of the component.

The secondary portion may have at least one local region adhesively bonded onto the front face of the support.

The flexible sheet may be at least partly embedded in the encapsulation block.

The flexible sheet may have perforations.

The flexible sheet may be made of copper or graphite.

A system including the electronic device is also provided, wherein the support may be mounted on a printed circuit board by means of electrical connection elements.

BRIEF DESCRIPTION OF THE DRAWINGS

Electronic devices provided with thermal dissipation members will now be described by way of non-limiting examples, illustrated by the drawing in which.

DETAILED DESCRIPTION

Figure 1:
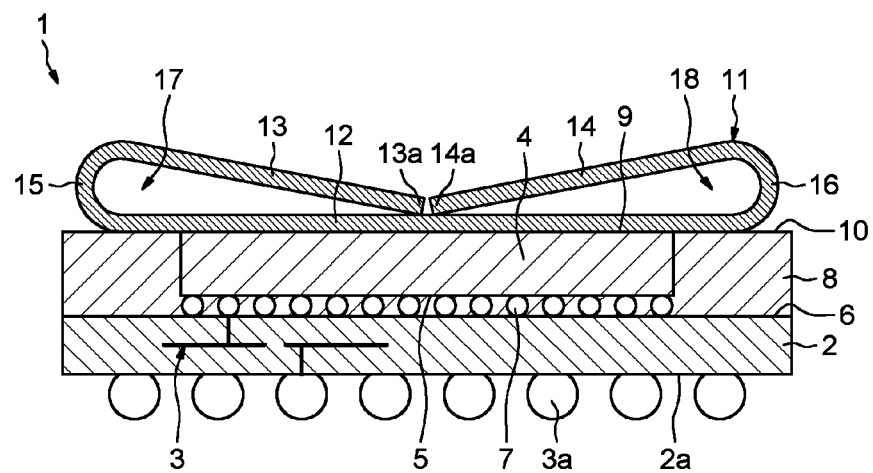
FIG. 1 represents a cross section of one electronic device.

So that the manner in which the above recited features can be understood in detail, a more particular description may be had by reference to embodiments, some of which are illustrated in the appended drawings, wherein like reference numerals denote like elements. It is to be noted, however, that the appended drawings illustrate various embodiments and are therefore not to be considered limiting of its scope, and may admit to other equally effective embodiments.

Figure 2:
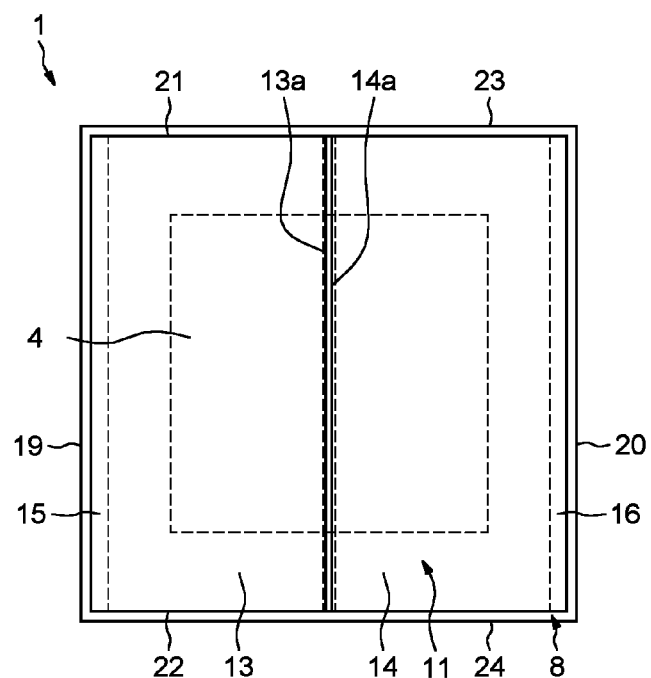
FIG. 2 represents a view from above of the electronic device of FIG. 1.

An electronic device 1 as illustrated in FIGS. 1 and 2 comprises a support wafer 2 provided with an integrated electrical connection network 3. The electronic device 1 also includes a component capable of producing heat, such as an integrated circuit chip 4 or any passive component, having a rear face 5 mounted above a front face 6 of the support wafer 2 by means of a plurality of electrical connection elements 7. The plurality of electrical connection elements 7 electrically connect the chip 4 to the electrical connection network 3.

The electronic device 1 furthermore comprises an encapsulation block 8, for example made of an epoxy resin, formed on the front face 6 of the support wafer 2 and enclosing the chip 4.

The front face 10 of the encapsulation block 8 is in extension of the front face 9 of the chip 4. The peripheral sidewalls of the encapsulation block 8 are perpendicular to the support wafer 2 and are in extension of the peripheral edges of the latter. For example, the electronic device 1 is in the form of a parallelepiped with a square contour.

The support wafer 2 is provided on its rear face 2*a* with a plurality of external electrical connection elements 3*a* connected to the electrical connection network 3, for example with a view to mounting on a printed circuit by means of these electrical connection elements 3*a*, in order to constitute a system and/or be integrated into a system, such as a mobile telephone or tablet.

The electronic device 1 is equipped with a thermal dissipation member, which is in the form of a folded sheet 11 made of a thermally conductive flexible material. This flexible sheet 11 comprises, as a main part, a main portion 12 which extends above the front face 9 of the chip 4 and above the front face 10 of the encapsulation block 8. The main portion 12 is fixed flat on these front faces 9 and 10. For example, the main part 12 is square.

The flexible sheet 11 furthermore comprises, as a secondary part, two opposite secondary portions 13 and 14 folded onto the main portion 12 while forming folds or bends 15 and 16 that are each generally shaped in the form of a loop, which are situated on either side of the main portion 12 and are parallel.

The secondary portions 13 and 14, which are substantially flat and rectangular, each extend approximately over half of the main portion 12, so that their ends 13a and 14a are adjacent and parallel to the folds 15 and 16 and are fixed on the main portion 12. The folds 15 and 16 are not compressed and are rounded, so that, apart from their adjacent ends 13a and 14a which are adjacent thereto or placed side by side, the secondary portions 13 and 14 are facing and at a distance from the main portion 12 while leaving separating spaces 17 and 18.

The flexible sheet 11 does not extend beyond the periphery of the encapsulation block 8. For example, the folds 15 and 16 of the sheet 11 are parallel to the two opposite sidewalls 19 and 20 of the encapsulation block 8 and are toward the inside relative to the sidewalls 19 and 20. The extreme lateral edges 21 and 22 of the sheet 11, which are perpendicular to the folds 15 and 16, are parallel to the other two opposite sidewalls 23 and 24 of the encapsulation block 8 and are toward the inside relative to these sidewalls 23 and 24.

According to one embodiment, a flexible rectangular sheet 11 is provided in a flat state. With the aid of a machine, end portions 13 and 14 are folded onto a central main portion 12 in order to obtain the sheet 11, and the ends 13a and 14a are adhesively bonded onto the main portion 12. Then, with the aid of a machine, the main portion 12 of the prefabricated sheet 11 obtained is placed and adhesively bonded onto the chip 4 and the encapsulation block in the desired position.

According to another embodiment, a flexible rectangular sheet 11 is provided in a flat state. With the aid of a machine, the central main portion 12 of this sheet 11 is placed and adhesively bonded onto the chip 4 and the encapsulation block 8 in the desired position. Then, with the aid of a machine, the secondary end portions 13 and 14 are folded onto the central main portion 12 and the ends 13a and 14a are fixed onto the main portion 12.

According to an alternative embodiment, the flexible sheet 1 may comprise as a second part four triangular secondary portions folded onto the main portion 12 while forming four pairwise opposite folds from the opposite sides of the main portion 12. The vertices of the four triangular secondary portions, which are adjacent in the region of the middle of the main portion 12, are adhesively bonded onto the latter. The adjacent sides of these triangular secondary portions are preferably at a distance from one another, so that there are slots between these sides.

The folded flexible sheet 11 has the advantage, for removing the heat produced by the chip 4, of having a large surface area, formed by the peripheral region of the rear face of the main portion 12, for heat exchange with the encapsulation block 8, and also having a large surface area, formed by the front face of the main portion 12 and the two opposing faces of the secondary portions 13 and 14 and of the folds 15 and 16, for heat exchange with the outside. Furthermore, the thickness of the electronic device 1 is comprises substantially only by addition of the thicknesses of the support wafer 2, of the chip 4 and of the folds 15 and 16, so that the bulk of the electronic device 1 remains small.

Figure 3:
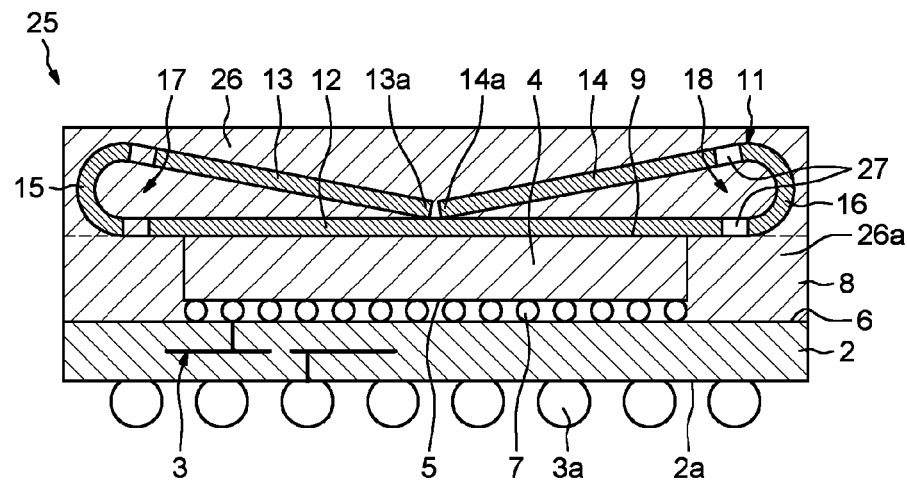
FIG. 3 represents a cross section of another electronic device.

According to one alternative embodiment, which is illustrated in FIG. 3, an electronic device 25 comprises the electronic device 1 and furthermore comprises an auxiliary encapsulation block 26, which is formed above the front face 10 of the encapsulation block 8 and in which the flexible sheet 11 is embedded. The encapsulation block 8 and the auxiliary encapsulation block 26 form a common block 26a for encapsulation of the chip 4 and of the flexible sheet 11. The electronic device 25, provided with the encapsulation block 8 and with the auxiliary encapsulation block 26, is of parallelepiped shape.

In order to facilitate flow of the encapsulation material when the encapsulation block 26 is being formed, it is advantageous for the flexible sheet 11 to have a plurality of expediently positioned perforations 27.

In this case as well, the folded flexible sheet 11 has the advantage, for removing the heat produced by the chip 4, of having a large surface area for heat exchange with the encapsulation block 26a, the heat exchange with the outside taking place via the outer surfaces of the encapsulation block 26a, and mainly via the front face of the auxiliary encapsulation block 26.

Figure 4:
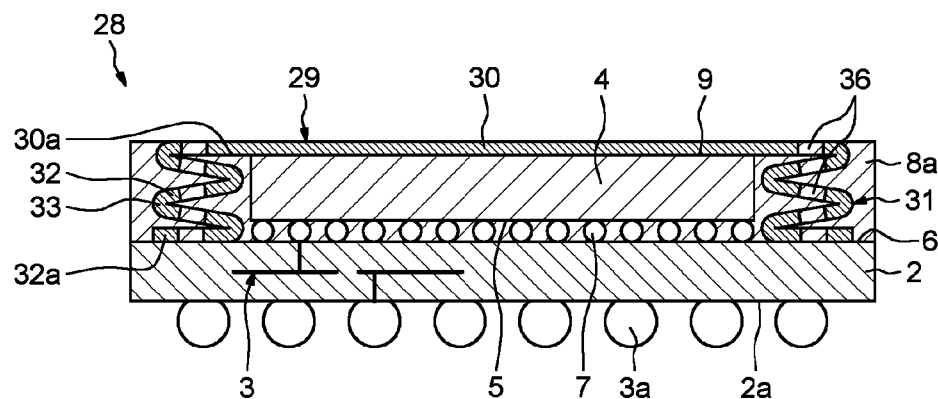
FIG. 4 represents a cross section of another electronic device.

According to one alternative embodiment, which is illustrated in FIG. 4, an electronic device 28 differs from the electronic device 1 described with reference to FIG. 1 in that it comprises a heat dissipator formed by a flexible sheet 29 made of a thermally conductive material, the shape and arrangement of which differ from those of the flexible sheet 11.

This flexible sheet 29 comprises, as a main part, a main portion 30 which extends above the front face 9 of the chip 4. The main portion 30, which is square, is fixed flat on these front face 9.

The flexible sheet 29 furthermore comprises, as a secondary part, four strips 31 which extend respectively from the four sides of the main portion 30 and laterally with respect to and at a distance from the sidewalls of the chip 4, these strips 31 being embedded in an encapsulation block 8a.

The strips 31 respectively comprise a plurality of secondary portions 32, which are folded in a concertina-like or accordion-like fashion, successively with respect to one another and with respect to the main portion 30, while forming folds 33. These folds 33 are respectively parallel to the corresponding sides of the main portion 30.

The secondary portions 32 extend facing one another and successively and alternately form Vs between them and with the end regions of the rear face of the main part 30.

The end portions 32a of the strips 31 which are furthest away from the main portion 30 have local regions adhesively bonded onto the front face 6 of the support wafer 2. Advantageously, the end portions 32a of the strips 31 may be fixed flat onto the support wafer 2.

Figure 5:
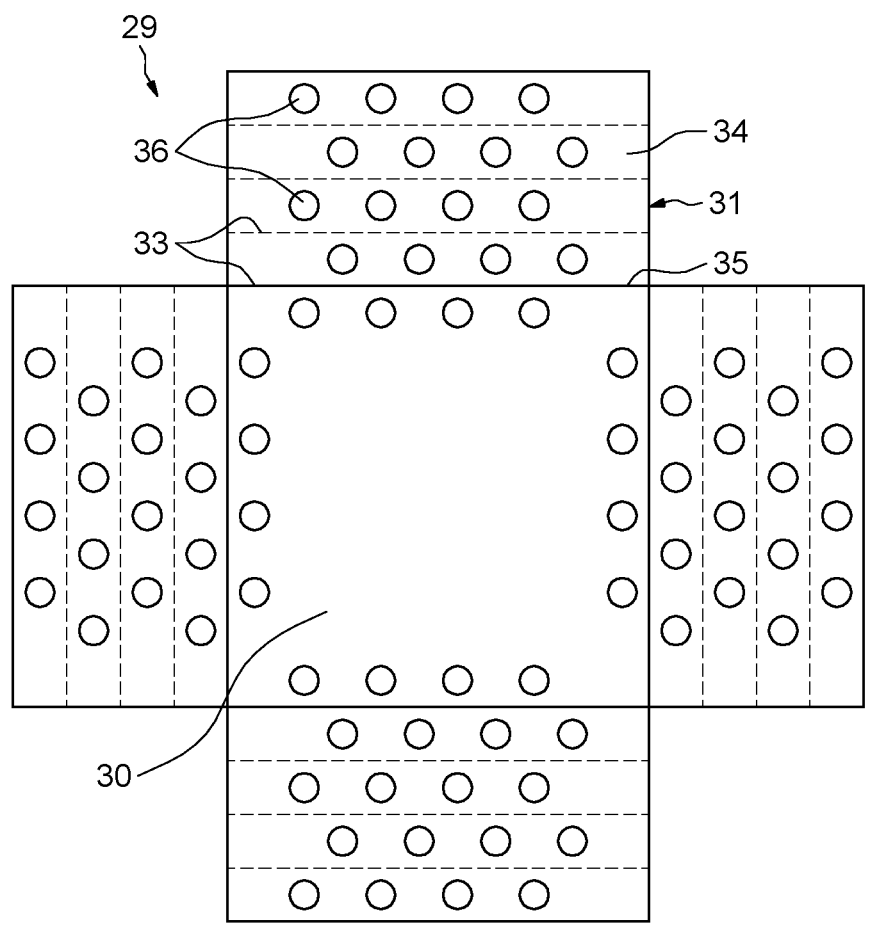
FIG. 5 represents a view from above, laid flat, of a thermal dissipation member of the electronic device of FIG. 4.

According to one embodiment, as illustrated in FIG. 5, a flat flexible sheet 30 is provided which comprises a central portion 30 and rectangular flaps 34 extending the sides 35 of this central portion 30.

With the aid of a machine, the flaps 34 are folded so as to form the strips 31.

Next, the prepared flexible sheet 30 is placed straddling the chip 4, and at the same time the rear face of the main portion 30 is adhesively bonded onto the front face 9 of the chip 4 and the end portions 32a of the strips 31 are adhesively bonded onto the front face 10 of the support wafer 2.

The encapsulation block 8a is then formed around the chip 4, while embedding the strips 31. In order to facilitate production of this encapsulation block, the strips 31 may have a plurality of expediently positioned perforations 36.

The folded flexible sheet 29 has the advantage, for removing the heat produced by the chip 4, of having on the one hand a large surface area, constituted by the front face of the main portion 30, for heat exchange with the outside, and on the other hand a large surface area, constituted by the faces of the strips 31, for heat exchange with the encapsulation block 8a, the heat exchange with the outside taking place via the outer surfaces of the encapsulation block 8a. Furthermore, the heat exchange with the support wafer 2 takes place via the end portions 32a of the strips 31.

The flexible sheets 11 and 29 of the exemplary embodiments described may be made of copper or graphite.

The fixing of the main parts 12 and 30 of the flexible sheets 11 and 29 onto the chip 4 may be carried out with the aid of a thin layer of a thermal adhesive or a thermal paste, or by thermocompression.

The ends 13a and 14a may be fixed onto the main portion 12 of the flexible sheet 11 by means of a thermal adhesive or a thermal paste.

The end portions 32a of the flexible sheet 29 may be fixed onto the support wafer 2 by means of a thermal adhesive or a thermal paste.

The electronic device may be obtained by collective fabrication in which a common panel comprises, at locations, integrated electrical connection networks in which the chips and the associated flexible sheets are placed by transfer and in which a common encapsulation block is produced. Cutting is then carried out, for example sawing, in order to separate the devices formed at each location.

Although the preceding description has been described herein with reference to particular means, materials and embodiments, it is not intended to be limited to the particulars disclosed herein; rather, it extends to all functionally equivalent structures, methods, and uses, such as are within the scope of the appended claims.

The invention claimed is:

1. A device, comprising:
   a support;
   an integrated circuit chip having a rear face mounted above a front face of the support and a front face opposite its rear face;
   a block for at least partial encapsulation of the integrated circuit chip above the front face of the support; and
   at least one thermal dissipation member comprising a flexible sheet having a plurality of successive portions, in which two successive portions are joined by a fold and at least partly face one another;
   wherein a first portion of the flexible sheet is fixed to the front face of the integrated circuit chip and a second portion of the flexible sheet is adhesively bonded onto the front face of the support.

2. The device according to claim 1, wherein successive portions are spaced apart from each other.

3. The device according to claim 1, wherein more than the two successive portions are joined by respective folds.

4. The device according to claim 1, wherein the first portion extends at least partly above the front face of the integrated circuit chip.

5. The device according to claim 4, wherein the fold and a second fold are disposed at a periphery of the integrated circuit chip.

6. The device according to claim 1, wherein the flexible sheet is at least partly embedded in the block.

7. The device according to claim 1, wherein the flexible sheet has perforations defined therein.

8. The device according to claim 1, wherein the flexible sheet is constructed at least partially from copper.

9. The device according to claim 1, wherein the flexible sheet is constructed at least partially from graphite.

10. The device according to claim 1, wherein the support is mounted on a printed circuit board by electrical connection elements.

11. An electronic device, comprising:
    a heat producing component;
    a thermal dissipation structure associated with the heat producing component to radiate heat away therefrom, the thermal dissipation structure comprising:
       a main portion in direct physical contact with the heat producing component;
       first and second secondary portions not in direct physical contact with the heat producing component, each first and second secondary portions forming a loop;
       wherein a distal end of the first secondary portion is in direct physical contact with the main portion and a distal end of the second secondary portion is in direct physical contact with the main portion; and
       wherein the first secondary portion extends from the loop of the first secondary portion downwardly toward the main portion at a first non-perpendicular angle and the second secondary portion extends from the loop of the second secondary portion downwardly to the main portion at a second non-perpendicular angle.

12. The electronic device of claim 11, wherein first and second gaps are defined between the first and second secondary portions and the main portion.

13. The electronic device of claim 11, wherein the second non-perpendicular angle is equal to the first non-perpendicular angle.

14. The electronic device of claim 11, wherein the first and second secondary portions are equal in length.

15. The electronic device of claim 11, wherein a length of the main portion is at most equal to a length of an encapsulation block that encapsulates the heat producing component.

16. The electronic device of claim 11, wherein perforations are defined in the first and second secondary portions.

17. The electronic device of claim 11, wherein the main portion is generally rectangular in shape.

18. The electronic device of claim 11, wherein the first and second secondary portions are generally rectangular in shape.

19. The electronic device of claim 11, wherein the main portion covers substantially an entire top surface of the heat producing component.

20. An electronic device, comprising:
    a support wafer;
    a heat producing component supported by the support wafer;
    a thermal dissipation structure associated with the heat producing component to radiate heat away therefrom, the thermal dissipation structure comprising:
       a main portion in direct physical contact with the heat producing component;

first and second secondary portions not in direct physical contact with the heat producing component; and wherein the first and second secondary portions extend downwardly from the main portion to the support wafer and are accordion pleated in shape.

21. The electronic device of claim 20, wherein the first and second secondary portions are equal in length.

22. The electronic device of claim 20, wherein perforations are defined in the first and second secondary portions.

23. The electronic device of claim 20, wherein the main portion is generally rectangular in shape.

24. The electronic device of claim 20, wherein the main portion covers substantially an entire top surface of the heat producing component.

25. A device, comprising:

a support;

an integrated circuit chip having a rear face mounted above a front face of the support and a front face opposite its rear face;

a block for at least partial encapsulation of the integrated circuit chip above the front face of the support; and at least one thermal dissipation member comprising a flexible sheet having a plurality of successive portions, in which two successive portions are joined by a fold and at least partly face one another, wherein the flexible sheet is constructed at least partially from graphite; and wherein a first portion of the flexible sheet is fixed to the front face of the integrated circuit chip and a second portion of the flexible sheet is fixed onto either the first portion or the front face of the support.

26. The electronic device of claim 11, wherein the heat producing component is an integrated circuit chip and the loop of the first secondary portion and the loop of the second secondary portion are disposed at a periphery of the integrated circuit chip.

* * * * *